INVENTORS
RICHARD GLICKSMAN
& EDGAR T. CASTERLINE
BY W.S. Hill
ATTORNEY

INVENTORS
RICHARD GLICKSMAN
EDGAR T. CASTERLINE
BY W. S. Hill
ATTORNEY

Sept. 29, 1964 R. GLICKSMAN ET AL 3,151,004

SEMICONDUCTOR DEVICES

Filed March 30, 1961 4 Sheets-Sheet 3

INVENTOR.
RICHARD GLICKSMAN
& EDGAR T. CASTERLINE
BY W. S. Hill
ATTORNEY

INVENTOR.
RICHARD GLICKSMAN
& EDGAR T. CASTERLINE
BY W.S. Hill
ATTORNEY 3,151,004
Patented Sept. 29, 1964

3,151,004

SEMICONDUCTOR DEVICES

Richard Glicksman, North Plainfield, and Edgar T. Casterline, Plainfield, N.J., assignors to Radio Corporation of America, a corporation of Delaware Filed Mar. 30, 1961, Ser. No. 99,576
11 Claims. (Cl. 148—33.3)

Figure 1:
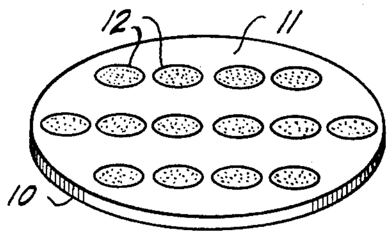

This invention relates to improved semiconductor junction devices and improved methods of fabricating them. More particularly, this invention relates to improved semiconductor devices having a junction or rectifying barrier of small or restricted area.

Semiconductor junction devices such as diodes, triode transistors, tetrodes, and the like contain at least one rectifying barrier or P-N junction, and may be broadly classed into 3 groups, depending on their ability to handle high currents. The first group consists of high power devices which are capable of switching or rectifying large currents. In order to keep the current density at the junction down to tolerable levels, these devices utilize junctions or rectifying barriers of relatively large area. In such devices the junction area may, for example, be equivalent to the area of a circle 20 mils or more in diameter. The second group consists of devices such as conventional audio transistors and diodes, which are not required to handle large currents. These types are fabricated with junctions of smaller area than the first group. Typically, the junction area of these devices may be equivalent to the area of a circle of 8 to 15 mils in diameter. The third group consists of devices intended for very rapid switching applications, or rapid pulse processing, as in computers. Since low current operation is preferred for units of this type, they are generally fabricated with junctions of smaller area than the second group. Typically, the junction area of these devices may be equivalent to the area of a circle of 3 to 5 mils diameter.

In some types of junction devices utilized for rapid switching and for small-signal low-power-level applications, such as tunnel diodes, it has been found that restriction of the active junction to an extremely small area is required. However, it has been found difficult to fabricate satisfactory devices with an extremely small junction area. Such units tend to be extremely fragile, and are difficult to adjust to the desired junction area.

Accordingly, it is an object of this invention to provide improved semiconductor devices.

Another object of this invention is to provide improved methods of fabricating improved semiconductor junction devices.

Still another object is to provide improved mechanically sturdy semiconductor junction devices having a restricted area junction.

But another object is to provide improved methods of introducing a restricted area junction in a semiconductor wafer.

These and other objects are attained according to the invention by the method of fabricating a semiconductor junction device comprising the steps of masking a limited area of a central portion of one face of a given conductivity type semiconductive wafer, and depositing a mass containing opposite conductivity type material on and around said mask, such that a junction of annular shape is formed between a portion of the mass and the wafer, but not in that portion of the wafer which is protected by the mask. The mask is preferably an electrically insulating material, so that the junction formed is around the periphery of the mask. In the unit thus formed, the masked portion of the wafer is electrically inert, but acts as a support for the electrically active small-area junction around the periphery of the mask.

Figure 3A:
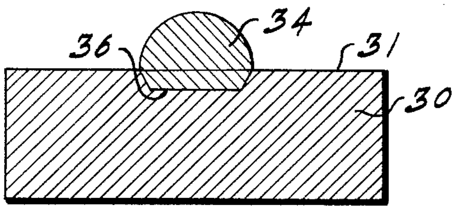
Figure 3B:
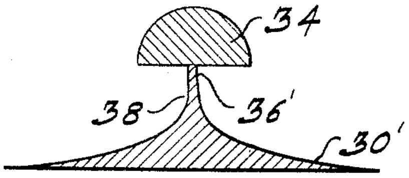
Figure 4:
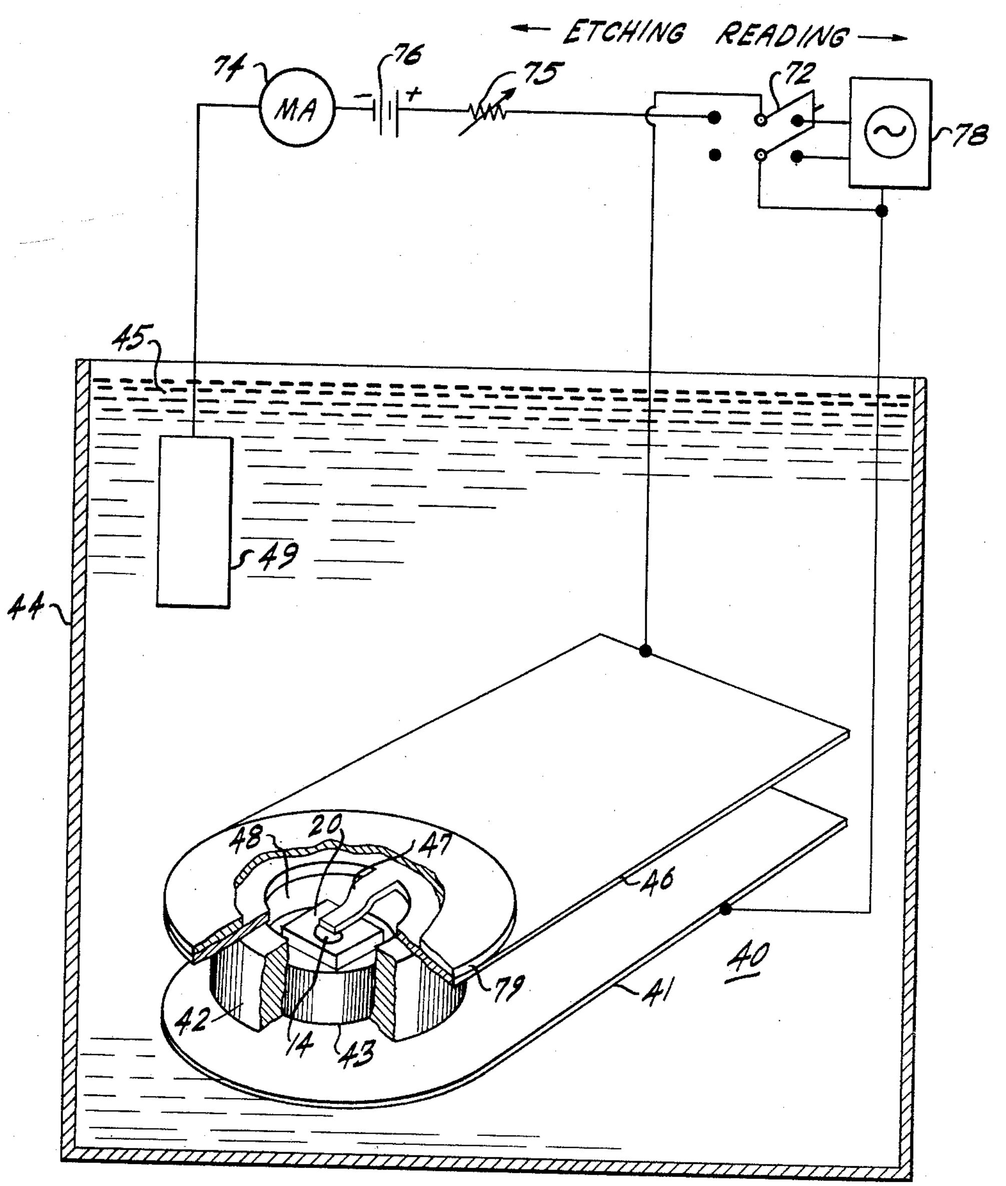
Figure 5A:
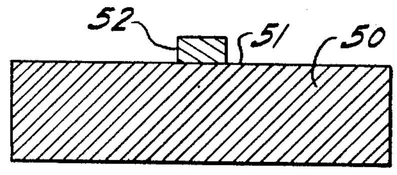
Figure 5B:
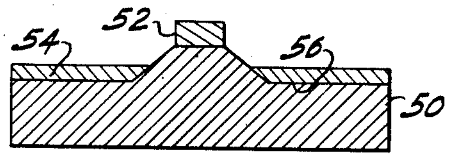
Figure 5C:
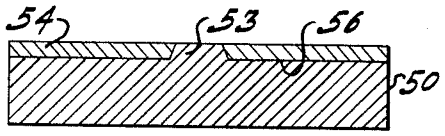
Figure 5D:
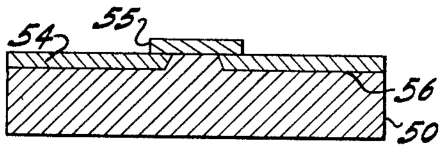
Figure 5E:
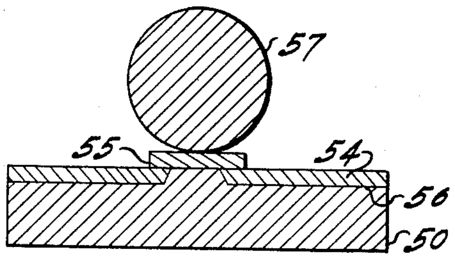
Figure 5F:
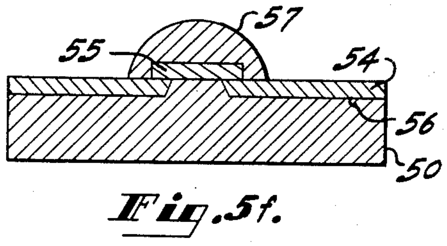
Figure 5G:
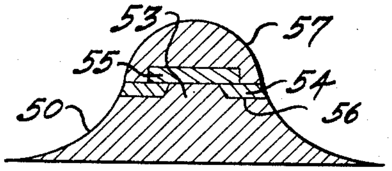
Figure 6:
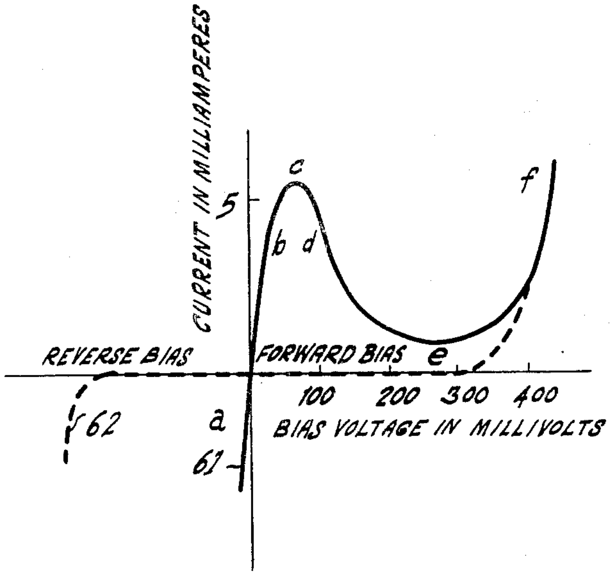
Figure 7:
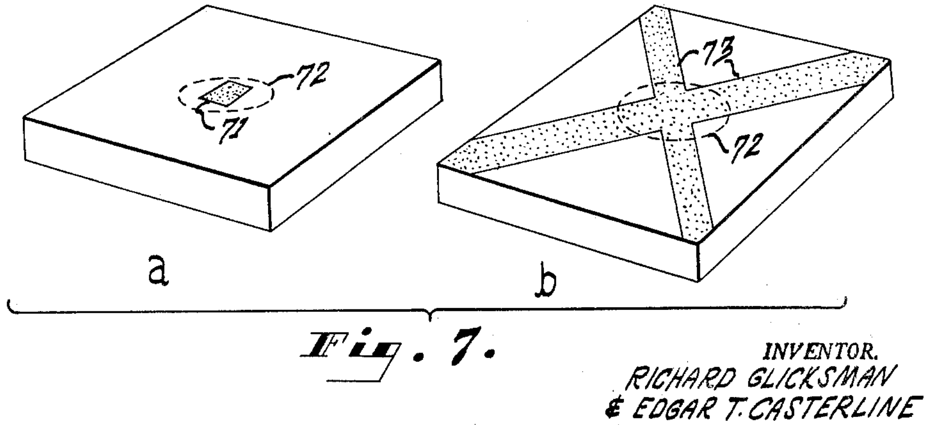

The invention and its objects and advantages will be described in greater detail by the following examples, in conjunction with the accompanying drawing, in which:

FIGURE 1 is a perspective view of a slice of masked semiconductive material utilized in one embodiment of the invention;

FIGURES 2*a*–2*d* are cross-sectional views illustrating successive steps in the fabrication of a semiconductor junction device according to the first embodiment of the invention;

FIGURES 3*a*–3*b* are cross-sectional views illustrating two steps in the fabrication of a semiconductor junction device of restricted area according to the prior art;

FIGURE 4 is a schematic view of a semiconductor junction device according to the invention being etched after mounting in a low-capacitance low-inductance case;

FIGURES 5*a*–5*g* are cross-sectional views illustrating successive steps in the fabrication of a semiconductor junction device according to a second embodiment of the invention;

FIGURE 6 is a graph showing the current vs. voltage curve of a tunnel diode; and FIGURES 7*a*–7*b* are perspective views of masked semiconductor wafers useful in other embodiments of the invention.

The characteristic curve for the variation of current I with bias voltage V in a tunnel diode is shown in FIGURE 6. The tunnel diode contains an abrupt junction between an N-type region and a P-type region in a semiconductor wafer. Since both the N-type and the P-type regions on either side of the junction are so heavily doped that the semiconductor is considered "degenerate," i.e., almost conductive, the depletion layer associated with this junction is very thin. Accordingly, it becomes possible for some charge carriers to tunnel through the thin barrier region. This tunneling of charge carriers causes the I-V characteristic of a tunnel diode, shown by the solid line 61 in FIGURE 6, to differ markedly from the I-V characteristic of a conventional diode, which is shown by the dotted line 62 in FIGURE 6. The conventional diode is blocking in the reverse direction until its breakdown voltage is reached, and does not pass much current in the forward direction until a characteristic forward voltage is applied.

The tunnel diode is highly conducting for all bias voltages in the reverse direction (portion *a* of the I-V curve 61 in FIGURE 6). At low forward bias, typically up to 100 millivolts, the current increases linearly with voltage, as shown in portion *b* of curve 61. The current reaches a maximum value (portion *c* of curve 61) known as the peak current and symbolized as $I_p$. With increasing forward bias, there is a region known as the negative resistance region (portion *d* of curve 61) in which the current decreases linearly with increasing voltage until it reaches a minimum value. The negative resistance of the diode is equal to the reciprocal of the slope of this portion *d* of the curve. The minimum current value (portion *e* of curve 61) attained at the end of the negative resistance region is known as the valley current and is symbolized as $I_v$. Thereafter the current increases exponentially with increasing forward bias, as shown in portion *f* of curve 61.

The P-N junction in the tunnel diode may be regarded as the equivalent of a parallel plate condenser, in which the two parallel plates have the same area as the junction and are separated by the thickness of the transition region (also known as the depletion layer), with the space between the two plates filled with an insulating material having the same dielectric constant as the semiconductor.

The expression for the gain-bandwidth product $G\Delta f$ of a tunnel diode utilized as an amplifier is $$\frac{1}{2\pi RC}$$

and the expression for the maximum operating frequency $f_0$ of a tunnel diode utilized as an oscillator is $$\left(\frac{R}{r}-1\right)^{1/2}\left(\frac{1}{2\pi RC}\right)$$

where $r$ is the total positive resistance in the signal circuit and is termed the series resistance, R is the negative resistance of the diode, and C is the capacitance of the diode junction.

Restricted junction areas are required in tunnel diodes to reduce the value of the peak current $I_p$. The peak current $I_p$ of the device is proportional to the product of the junction area and the doping or charge carrier concentration adjacent the junction. In a germanium tunnel diode having a junction area equivalent to an 8 mil diameter circle, the peak current might be as high as 5 amperes. This value is too high for devices intended to operate at low-power levels such as 5 milliamperes. It is therefore necessary to reduce the junction area of such a device by a factor of about 1,000 in order to reduce the peak current to an acceptable level.

It has been found that the switching time of a tunnel diode in seconds is approximately equal to $$\left(\frac{V_f-V_p}{I_p-I_v}\right)(C)$$

where $V_f$ is the applied forward bias voltage in millivolts, $V_p$ is the peak voltage in millivolts, $I_p$ is the peak current in milliamperes, $I_v$ is the valley current in milliamperes, and C is the capacitance of the unit, that is, the junction capacitance plus any associated capacitance due to the case and the leads, in farads.

Various methods have been utilized to fabricate semiconductor devices having a junction restricted to a small area. One method has been to introduce a conductivity type-determining material, that is, an acceptor or a donor, into an exposed portion of the upper surface of a mesa on a semiconductor wafer. Typically, units of this type have a junction area which is about one mil wide and three mils long. However, it is difficult to form a good electrical connection to the junction in such mesa units. More important, it is not possible to adjust the junction area and junction capacitance to some desired value after the junction has been formed. Another method has been to alloy a conductivity type-determining pellet of convenient size to one face of a semiconductive wafer of opposite conductivity type, thereby forming a junction between the pellet and the wafer. The pellet may for example be a spherule or disc having a diameter of about 5 to 8 mils. An electrical lead wire is readily attached to an alloyed pellet of this size. A portion of the semiconductor wafer around the alloyed pellet is then removed, for example by electrolytic etching, so as to reduce the area of the junction to the desired value. Thus in this method electrical connections are readily fabricated, and the junction areas formed may be conveniently reduced to the desired area. However, a serious difficulty in this method is that it is necessary for reduction of the junction area to remove a large portion of the semiconductor wafer material immediately beneath the pellet, so that the resulting device comprises an alloyed mass of conductivity type-determining material which overhangs the top of a small spike of semiconductive material containing the junction. This structure is mechanically weak and fragile, so that units thus fabricated have a high scrap rate and are easily injured by shock or vibration.

*Example I*

According to one embodiment of this invention, restricted area low-capacitance junction devices are fabricated of semiconductive material such as a cross-sectional slice of a monocrystalline ingot. Any crystalline semiconductive material, such as germanium, silicon, germanium-silicon alloys, indium phosphide, gallium arsenide and the like may be utilized for this purpose. In this example, the semiconductive slice 10 is formed of P-type germanium, and has the shape of a disc, as shown in FIGURE 1. The disc or slice 10 in this example is about 9 mils thick, 0.5 square inch in area, and contains sufficient gallium to have a concentration of about $8\times10^{19}$ to $1\times10^{20}$ charge carriers per $cm.^3$ The precise dimensions are not critical in the practice of the invention. Advantageously, debris and impurities on the surface of slice 10 are removed by etching the slice for 5 seconds in a solution consisting of one part by volume of a solution of .55 gram KI in 100 ml. water with four parts by volume of a solution consisting of 6 volumes water, 3 volumes concentrated acetic acid, and 1 volume concentrated hydrofluoric acid, and thereafter one major face 11 of slice 10 is cleaned by ion bombardment in vacuo, utilizing nitrogen ions from a glow discharge of 2000 volts D.C. at a current density of 0.2 $ma./cm.^2$.

Limited areas 12 of face 11 on slice 10 are then masked. This may conveniently be accomplished by maintaining wafer 10 at 150° C. in a vacuum evaporator, and positioning over wafer face 11 a metal plate (not shown) as a mask having a regular array of perforations. In this example, the perforations are circular, about 3 mils in diameter and 30 mils on centers. A film of insulating material is then evaporated with the mask in place in vacuum over face 11 of slice 10. Insulating materials such as silicon monoxide, silicon dioxide, magnesium hydroxide, magnesium fluoride, silicones and colloidal graphite suspensions may be utilized for this purpose. In this example, the insulating material is silicon monoxide, and evaporation is performed at a temperature of about 1600° C. and a pressure of about $10^{-5}$ mm. Hg. As a result of this step, face 11 of slice 10 is covered with an array of areas 12 coated with silicon monoxide. The masked areas 12 thus conform to the perforations in the metal plate, and hence in this example are circles 3 mils in diameter and 30 mils on centers. The silicon monoxide film is conveniently about 18,000 A. thick.

Figure 2A:
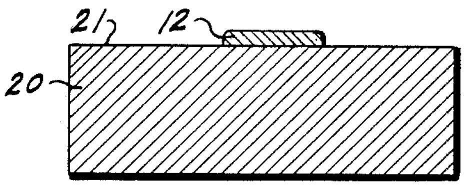

The slice 10 is now diced by scribing it with a diamond point and then breaking it into small dice, which in this example are wafers 30 x 30 mils square. As shown in FIGURE 2*a*, each die or wafer 20 bears on one major face 21 a mask of limited area in the form of a silicon monoxide film 12. The wafers are cleaned by immersing them for one minute in a trichloroethylene bath in which ultrasonic energy is applied, and are then rinsed in trichloroethylene.

Figure 2B:
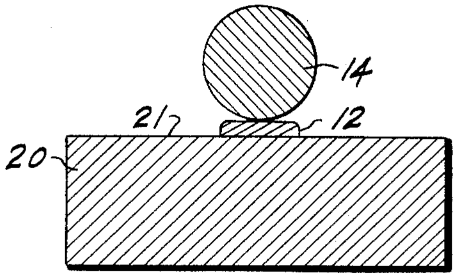

Each wafer 20 is now loaded, with the silicon monoxide mask 12 uppermost, into an open furnace boat (not shown), and a mass of metal 14 containing opposite conductivity type-determining material is deposited on and around mask 12 in order to form a junction around the periphery of mask 12. In this embodiment, the junction is formed by surface alloying, and the mass 14 is composed of 97 weight percent tin-3 weight percent arsenic. While arsenic is the type-determining material in this example, other materials which are donors in germanium, such as phosphorus, antimony, and bismuth, may be utilized in mass 14 when the wafer 20 is P-type germanium. When the wafer 20 is N-type germanium, acceptors such as boron, aluminum, gallium, and indium are utilized in mass 14. When wafer 20 consists of P-type gallium arsenide or indium phosphide, suitable donors for mass 14 are sulphur, selenium and tellurium. When wafer 20 consists of N-type gallium arsenide, suitable acceptors for mass 14 are manganese, zinc and cadmium. The shape of mass 14 is not critical, and may for example be a disc or a spherule. In this example, mass 14 is a dot or spherule of 8 mils diameter. The mass or spherule 14 is conveniently picked up with a pointed tool wetted with glycerine containing 1 weight percent ammonium chloride, and is positioned on mask 12 as shown in FIGURE 2*b*. The glycerine holds mass 14 in place for the subsequent alloying step, and the ammonium chloride acts as a flux to promote uniform alloying.

Figure 2C:
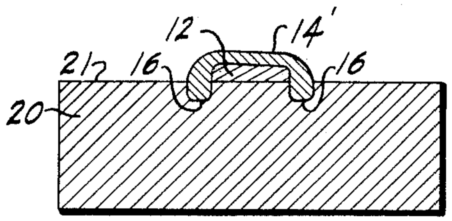

The assemblage of furnace boat, wafer 20, mask 12 and mass 14 is then heated in a furnace (not shown) so as to fuse or alloy mass 14 to face 21 of wafer 20. Preferably a non-oxidizing or reducing atmosphere is maintained in the furnace during this step. The optimum heating profile utilized depends on such factors as the particular semiconductor utilized, the composition of the conductivity type-determining mass, and the like, and hence is best determined by tests. In this example, alloying is performed by heating the assemblage for 7 minutes at about 480° C. in a hydrogen ambient. The assemblage is then allowed to cool in the furnace while maintaining an atmosphere of hydrogen. During this heating cycle the mass 14 is melted, and on cooling re-solidifies in a roughly hemispherical shape 14' as shown in FIGURE 2*c*. The portion of the re-solidified mass 14' which overhangs the mask 12 is thus alloyed to face 21 of wafer 20, and forms a junction 16 around the periphery of mask 12. However, no such alloying takes place beneath the central portion of mass 14', because the inert insulating mask 12 serves as a physical barrier between those portions of mass 14' and wafer 20 which are respectively immediately above and below mask 12.

Each alloyed wafer is now removed from the furnace, and tested to determine the "peak" (maximum) and "valley" (minimum) current for low voltages applied in the forward direction. For germanium tunnel diodes thus fabricated the peak current should be within the range of 80 milliamperes to 8 amperes. For germanium tunnel rectifiers thus fabricated, the peak current $I_p$ should be within the range of 80 to 350 milliamperes. Tunnel rectifiers are low peak current, low capacitance tunnel diodes which are utilized with a reverse bias as rectifiers.

Figure 2D:
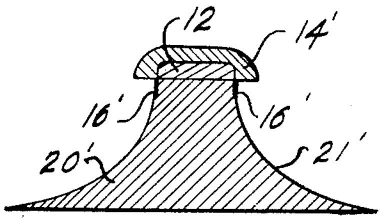

The peak current $I_p$ of each unit can now be adjusted to a desired value by removing a portion of the wafer material around the mask 12 so as to reduce the area of the junction 16. One method of removing the wafer material is by electrolytic etching, so that in the etched wafer 20' the one major face 21' slopes downward from the mask 12, as shown in FIGURE 2*d*. Alternatively, other methods of removing a portion of the wafer material may be utilized, such as chemical etching and the like. The remaining portion 16' of the junction thus has smaller area and lower capacitance than the original junction 16. However, although the remaining portion 16' of the junction is small in area, it is sturdily supported by the electrically inert portion of wafer 20' which is immediately beneath mask 12. Furthermore, this structure removes the lower limit of effective tunneling junction area and makes possible the fabrication of tunnel diodes with capacitances as low as 1 to 3 picofarads and having relatively low series resistance. Another advantage of the method of the invention is that it allows the use of semiconductive materials with higher charge carrier concentrations, for example germanium containing $8\times10^{19}$ to $1\times10^{20}$ charge carriers per cm.$^3$, to fabricate tunnel diodes having low peak currents. This has resulted in tunnel diodes which exhibit less deviation in peak current with change in temperature than prior art units.

For comparison, the fabrication of a restricted area junction device according to the prior art is illustrated in FIGURE 3*a* and FIGURE 3*b*. In this example, a mass 34 of conductivity type-determining material is alloyed to one major face 31 of a crystalline semiconductive wafer 30, as shown in FIGURE 3*a*. The wafer 30 and the mass 34 may be of the same composition, size and shape as the wafer 20 and mass 14 in the first embodiment. A junction 36 of relatively large area is thus formed between the alloyed mass 34 and wafer 30. When the mass is originally a spherule of 8 mil diameter, the area junction is equivalent to that of a circle of about 10 mils diameter. The area of junction 36 can now be reduced by removing a portion of the wafer material around the alloyed mass 34, as shown in FIGURE 3*b*, so as to leave mass 34 resting on and overhanging a thin spike 38 of the semiconductor wafer material. The area of the remaining portion 36' of the junction may thus, with considerable difficulty and a high scrap rate, be adjusted to the same low value as junction 16' in FIGURE 5. However, it will be seen that the prior art device of FIGURE 3*b* is mechanically very weak and is easily injured, since it requires that a relatively large mass of material 34 be supported on a thin spike 38 of P-type portion 53 of the wafer.

One especially convenient method of reducing the area of junction 16 is shown in FIGURE 4. The alloyed wafer 20 is mounted in a low-resistance, low-capacitance case 40 comprising a metal plate 41 bonded to one end of an insulating cylinder such as ceramic washer 42. The wafer 20 may be mounted directly on the portion of plate 41 within ceramic washer 42, or may be soldered to a metal pedestal 43 on plate 41 within washer 42. As shown in the drawing, the wafer 20 is soldered to pedestal 43 with the alloyed dot 14 uppermost. A second metal plate 46 which includes a finger or prong 47 projecting into an aperture 48 is hermetically sealed to the open end of ceramic washer 42. The prong or lobe 47 is then bent down to make an electrical connection to the alloyed drop 14. The cover plate 79 is not applied until the end of the etching process.

The case 40 and its contents are then immersed in a tank 44 containing an electrolytic etching bath 45. In this example, the etching bath 45 consists of a 25 weight percent aqueous solution of potassium hydroxide. The tank 44 also contains a carbon rod 49 which serves as the cathode of the bath. The case 40 is connected as the anode of the bath. The etching circuit contains a double-pole double-throw switch 72, a milliammeter 74, and a variable resistance or rheostat 75 in series with a source of direct current, such as a battery 76. A curve tracer 78 is connected between plates 41 and 46 of case 40. The curve tracer 78 contains its own power supply, and is turned on or off by switch 72. Since plates 41 and 46 and pedestal 43 must withstand the action of the etching bath 45, they are preferably made of an inert metal or alloy, or are coated with an inert or noble metal. In this example, plates 41 and 46 and pedestal 43 consist of a gold-plated alloy of nickel-iron-cobalt, such as Kovar, Fernico or the like.

In operation, the etching circuit is energized for periods of about 5 to 10 seconds by closing switch 72 in the appropriate (etching) direction. Switch 72 is then closed in the opposite direction so as to read the peak current of the device on curve tracer 78. At the beginning of the etching cycle, the rheostate 75 is adjusted so that the current shown on milliammeter 74 is about 250 milliamperes. The switch 72 is then closed in the appropriate (reading) direction, and the peak current $I_p$ of the device is read on the curve tracer 78. This cycle of etching the unit for 5 to 10 seconds and then reading the peak current is repeated a number of times, during which process the rheostat 75 is adjusted so that the current shown on milliammeter 74 slowly decreases, becoming as low as 20 milliamperes. When the peak current $I_p$ of the device as read on curve tracer 78 is reduced to the desired value, for example 5 milliamperes, the etching process is halted. For a germanium unit, the entire etching process may take about 3 minutes. The case 40 is then removed from the etching bath 45, washed in deionized water, dried, and then hermetically sealed by welding a metal plate 79 over the aperture 48 in plate 46.

Tunnel diodes thus fabricated have exhibited the ability to perform switching in a period of time so small that it may be stated as 20 picoseconds, a picosecond being $10^{-12}$ seconds. Other units have shown the following electrical parameters:

| Peak Current, Milliamperes | Valley Current, Milliamperes | Series Resistance, Ohms | Capacitance, Picofarads | Switching Time, Nanoseconds |
|---|---|---|---|---|
| 0.91 | .17 | 2.7 | 2.7 | 1.5 |
| 1.1 | .20 | 2.4 | 2.6 | 1.1 |
| 5.0 | 1.0 | 1.9 | 4.5 | 0.5 |
| 4.8 | 0.5 | 1.9 | 3.0 | 0.3 |
| 10.3 | .95 | 2.6 | 2.5 | 0.1 |
| 9.1 | 1.0 | 1.9 | 2.5 | 0.1 |
| 39 | 5.5 | 3.2 | 3.0 | .04 |
| 54 | 8.0 | 2.0 | 2.5 | .02 |

Tunnel rectifiers similarly fabricated have exhibited the following electrical characteristics:

| | | | | |
|---|---|---|---|---|
| .85 | .13 | 3.4 | 2.3 | 1.3 |
| .53 | .08 | 2.9 | 3.0 | 2.7 |
| .22 | .05 | 3.4 | 1.2 | 2.8 |

The switching times listed above were too small for direct measurement on presently available instruments, and hence were calculated from the electrical parameters by the equation recited above.

*Example II*

According to a second embodiment of the invention, a restricted area junction device is fabricated by suitably masking a portion of a semiconductor wafer. In this example (FIGURES *5a–5g*) a given conductivity type wafer 50 is prepared with an inert mask 52 on a portion of one major wafer face 51, as shown in FIGURE *5a*. Wafer 50 may be prepared by dicing a large slice, as described in Example I. In the embodiment of Example II, wafer 50 initially consists of germanium doped with sufficient gallium to contain from $8\times10^{-19}$ to $1\times10^{-20}$ charge carriers per cm.$^3$. Mask 52 in this example is circular in form and 3 mils in diameter, and may consist of any of the insulating materials mentioned above.

Major face 51 is now flooded with a melt (not shown) consisting of 50 grams tin-lead solder and 2 grams germanium arsenide. A portion of the semiconductor wafer material is thus dissolved in the melt. The flooded wafer is then cooled slightly, so that the dissolved semiconductor material is redeposited on the wafer surface in the form of an N-type layer 54. The melt is then decanted from the wafer. A P-N junction 56 is thus formed between the N-type redeposited layer 54 and the P-type bulk of the wafer. However, as shown in FIGURE *5b*, the portion of the wafer immediately beneath mask 52 is not covered by the redeposited layer and projects above N-type layer 54, since in this example the redeposited zone 54 is thinner than the portion of wafer 50 which was dissolved from wafer face 51 by the melt.

The wafer 50 is now lapped flat so as to remove the mask 52 and the part of the wafer projecting above layer 54. A circular P-type region 53 is thus exposed in the center of face 51 of wafer 50, as shown in FIGURE *5c*. This central portion 53 is covered with a second mask 55, as shown in FIGURE *5d*. In this example, mask 55 is circular in form and has a diameter of 7 mils.

Next, a mass 57 of a material which will make an ohmic connection to N-type layer 54 is positioned on mask 55, as shown in FIGURE *5e*. In this example, the mass 57 consists of lead, and is in the form of a spherule or dot 9 mils in diameter. The assembly of wafer 50, mask 55 and dot 57 is heated to about 330° C. in a reducing ambient, so that the dot 57 melts and alloys to the N-type layer 54 in a region around the periphery of mask 55. As shown in FIGURE *5f*, the alloyed dot 57' assumes a hemispherical shape.

The wafer 50 is then anodically etched as described in Example I above to remove a portion of the wafer face around the ohmic contact 57. Most of the N-type regrown region 54 and the P-N junction 56 is thus removed, as shown in FIGURE *5g*. The remaining N-type regrown region 54' and the remaining P-N junction portion 56' are the portions immediately around the periphery of mask 55. The remaining junction portion 56' is mechanically sturdy, since it is supported by the central P-type portion 53 of the wafer.

It will be understood that the embodiments described above are by way of example only, and not limitation. Various modifications and variations may be made without departing from the spirit and scope of the invention. For example, in the embodiments described above in Example I, a given conductivity type semiconductor wafer 70 may be utilized bearing on one face a mask 71 of any convenient configuration, for example a square, as shown in FIGURE *7a*. A mass of opposite conductivity type-determining material such as a spherule may be positioned over the mask 71 in the location shown by the dotted line 72, and then alloyed to wafer 70. Alternatively, as shown in FIGURE *7b*, the mask 71 may be deposited on one face of a given conductivity type semiconductor wafer 70 in the form of stripes 73. A mass of opposite conductivity type-determining material such as a dot or spherule may be positioned as shown by dotted line 72 in FIGURE *7b*, and then alloyed to wafer 70. In each case, a junction is formed between a portion of the mass of opposite conductivity material and the wafer 70. The area of the junction can be further reduced by etching, as described above in Example I. Similar changes may be made in the embodiment described above in Example II.

Other modifications may be made. For example, other semiconductors and other doping agents may be utilized and the conductivity types of the various regions reversed. Other inert insulating materials which are sufficiently heat-resistant may be used as the mask. A thin ceramic disc placed on the surface of a semiconductor wafer will also serve as a mask. The mass of conductivity type-determining material 14 in Example I and the mass of ohmic material 57 in Example II may be deposited by evaporation instead of surface alloying.

What is claimed is:

1. A semiconductor junction device comprising a semiconductive wafer of given conductivity type, a mask of electrically insulating material on a portion of one face of said wafer, and a mass of opposite conductivity type-determining material on said mask alloyed to said one wafer face only around said mask periphery so as to form a rectifying barrier around the outer periphery only of said mask, said one wafer face sloping downward from said periphery of said mask so as to restrict the area of said rectifying barrier.

2. A semiconductor junction device comprising a semiconductive wafer of given conductivity type, a mask on a portion of one face of said wafer, and a mass of opposite conductivity type-determining material on said mask alloyed to said one wafer face around said mask only so as to form a rectifying barrier around the outer periphery only of said mask, said mask being a heat-resistant electrically insulating material selected from the group consisting of silicon monoxide, silicon dioxide, magnesium hydroxide, magnesium fluoride, silicones and colloidal graphite suspensions.

3. A semiconductor junction device comprising a semiconductive wafer of given conductivity type, a mask on a portion of one face of said wafer, and a mass of opposite conductivity type-determining material on said mask alloyed to said one wafer face around said mask only so as to form a rectifying barrier around the outer periphery only of said mask, said mask being a heat-resistant electrically insulating material selected from the group consisting of silicon monoxide, silicon dioxide, magnesium hydroxide, magnesium fluoride, silicones and colloidal graphite suspensions, said one wafer face sloping downward from said periphery of said mask so as to restrict the area of said rectifying barrier.

4. A diode comprising an N-type germanium wafer, a mask of electrically insulating material on a portion of one face of said wafer, and a mass of conductivity type-determining material on said mask alloyed to said one wafer face around said mask only so as to form a rectifying barrier around the outer periphery only of said mask, said mass of conductivity type-determining material including at least one element selected from the group consisting of boron, aluminum, gallium and indium.

5. A diode comprising an N-type germanium wafer, a mask of electrically insulating material on a portion of one face of said wafer, and a mass of conductivity type-determining material on said mask alloyed to said one wafer face around said mask only so as to form a rectifying barrier around the outer periphery only of said mask, said mass of conductivity type-determining material including at least one element selected from the group consisting of boron, aluminum, gallium and indium, said one wafer face sloping downward from said periphery of said mask so as to restrict the area of said rectifying barrier.

6. A tunnel diode comprising a P-type germanium wafer including sufficient gallium so as to have a charge carrier concentration of about $8\times10^{19}$ to $1\times10^{20}$ charge carriers per cubic centimeter, a silicon monoxide mask on a portion of one face of said wafer, and a tin-arsenic pellet on said mask alloyed to said one wafer face around said mask only so as to form a rectifying barrier around the outer periphery only of said mask.

7. A semiconductor junction device comprising a semiconductive wafer of given conductivity type;
- an electrically insulating mask on a central portion of one face of said wafer;
- an opposite conductivity type zone on said one wafer face around said mask;
- a p–n junction between said zone and the bulk of said wafer;
- and a mass of material on and around said mask alloyed to said zone around the periphery only of said mask, said material forming an ohmic contact to said opposite type surface zone.

8. A semiconductor junction device comprising a semiconductive wafer of given conductivity type;
- an electrically insulating mask on a central portion of one face of said wafer;
- an opposite type zone on said one wafer face around said mask;
- a p–n junction between said zone and the bulk of said wafer;
- and a mass of material on and around said mask alloyed to said zone around the periphery only of said mask, said material forming an ohmic contact to said opposite type surface zone, said one wafer face sloping downward from said mass so as to restrict the area of said p–n junction.

9. A tunnel diode comprising a given conductivity type germanium wafer;
- an electrically insulating mask on a central portion of one face of said wafer;
- an opposite conductivity type zone on said one wafer face around said mask;
- a p–n junction between said zone and the bulk of said wafer;
- and a mass of material on and around said mask alloyed to said zone around the periphery only of said mask, said material forming an ohmic contact to said zone, said one wafer face sloping downward from said mass so as to restrict the area of said p–n junction.

10. A tunnel diode comprising a given conductivity type gallium arsenide wafer;
- an electrically insulating mask on a central portion of one face of said wafer;
- an opposite conductivity type zone on said one wafer face around said mask only;
- a p–n junction between said zone and the bulk of said wafer;
- and a mass of material on and around said mask alloyed to said zone around the periphery only of said mask, said material forming an ohmic contact to said zone, said one wafer face sloping downward from said mass so as to restrict the area of said p–n junction.

11. A tunnel diode comprising a p-type germanium wafer including sufficient gallium to have a charge carrier concentration of about $8\times10^{19}$ to $1\times10^{20}$ charge carriers per cubic centimeter;
- a silicon monoxide mask on a portion of one face of said wafer;
- and a tin-arsenic pellet on said mask alloyed to said one wafer face around said mask only so as to form a rectifying barrier around the outer periphery only of said mask, said one wafer face sloping downward from said periphery so as to restrict the area of said rectifying barrier.

References Cited in the file of this patent

UNITED STATES PATENTS

| | | |
|---|---|---|
| 2,841,510 | Mayer | July 1, 1958 |
| 2,858,489 | Henkels | Oct. 28, 1958 |
| 2,879,188 | Strull | Mar. 24, 1959 |
| 2,937,114 | Shockley | May 17, 1960 |
| 2,944,321 | Westberg | July 12, 1960 |
| 2,947,925 | Maynard et al. | Aug. 2, 1960 |
| 2,953,488 | Shockley | Sept. 20, 1960 |
| 2,980,560 | Weiser | Apr. 18, 1961 |
| 2,983,631 | Hanlet | May 9, 1961 |
| 2,989,385 | Gianola et al. | June 20, 1961 |
| 3,009,841 | Faust | Nov. 21, 1961 |
| 3,010,855 | Barsen et al. | Nov. 28, 1961 |
| 3,016,313 | Pell | Jan. 9, 1962 |

UNITED STATES PATENT OFFICE

CERTIFICATE OF CORRECTION

Patent No. 3,151,004 September 29, 1964

Richard Glicksman et al.

It is hereby certified that error appears in the above numbered patent requiring correction and that the said Letters Patent should read as corrected below.

Column 6, line 17, strike out "P-type portion 53 of the wafer." and insert instead -- the original wafer. --.

Signed and sealed this 16th day of February 1965.

(SEAL)
Attest:

ERNEST W. SWIDER
Attesting Officer

EDWARD J. BRENNER
Commissioner of Patents